(12) United States Patent
Son et al.

(10) Patent No.: US 7,099,202 B1
(45) Date of Patent: Aug. 29, 2006

(54) Y-MUX SPLITTING SCHEME

(75) Inventors: Jinshu Son, Saratoga, CA (US); Liqi Wang, Mt. View, CA (US); Minh V. Le, Richmond, CA (US); Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/102,906

(22) Filed: Apr. 8, 2005

(51) Int. Cl.
*G11C 11/34* (2006.01)

(52) U.S. Cl. ............................. 365/189.05; 365/189.02

(58) Field of Classification Search .......... 365/189.05, 365/189.02
See application file for complete search history.

(56) References Cited

U.S. PATENT DOCUMENTS

| 4,439,857 | A | * | 3/1984 | Rauth et al. ................ 370/503 |
| 5,262,990 | A | * | 11/1993 | Mills et al. ............ 365/189.02 |
| 5,440,506 | A | * | 8/1995 | Longway et al. ........... 365/104 |
| 5,463,582 | A | * | 10/1995 | Kobayashi et al. ..... 365/189.05 |
| 6,091,620 | A | | 7/2000 | Kablanian ..................... 365/63 |
| 6,163,475 | A | * | 12/2000 | Proebsting .................... 365/63 |
| 6,310,817 | B1 | | 10/2001 | Kablanian ............. 365/230.04 |
| 6,738,279 | B1 | | 5/2004 | Kablanian ..................... 365/72 |
| 2002/0044493 | A1 | * | 4/2002 | Bohm et al. ........... 365/230.02 |
| 2002/0089872 | A1 | * | 7/2002 | Hsu et al. .................... 365/149 |
| 2005/0105380 | A1 | * | 5/2005 | Takahashi et al. .......... 365/233 |

* cited by examiner

*Primary Examiner*—Michael Tran
(74) *Attorney, Agent, or Firm*—Schneck & Schneck; Thomas Schneck

(57) ABSTRACT

A multiplexer circuit in a memory organized into page-portions has a plurality of bit-select multiplexers configured to couple a plurality of page-portion global bitlines to a sense amplifier input. A plurality of column address lines organized into data bytes comprises each page-portion. A plurality of column multiplexers couple the data bytes to the page-portion global bitlines such that each of the address lines comprising the data byte is coupled to one of the page-portion global bitlines.

7 Claims, 2 Drawing Sheets

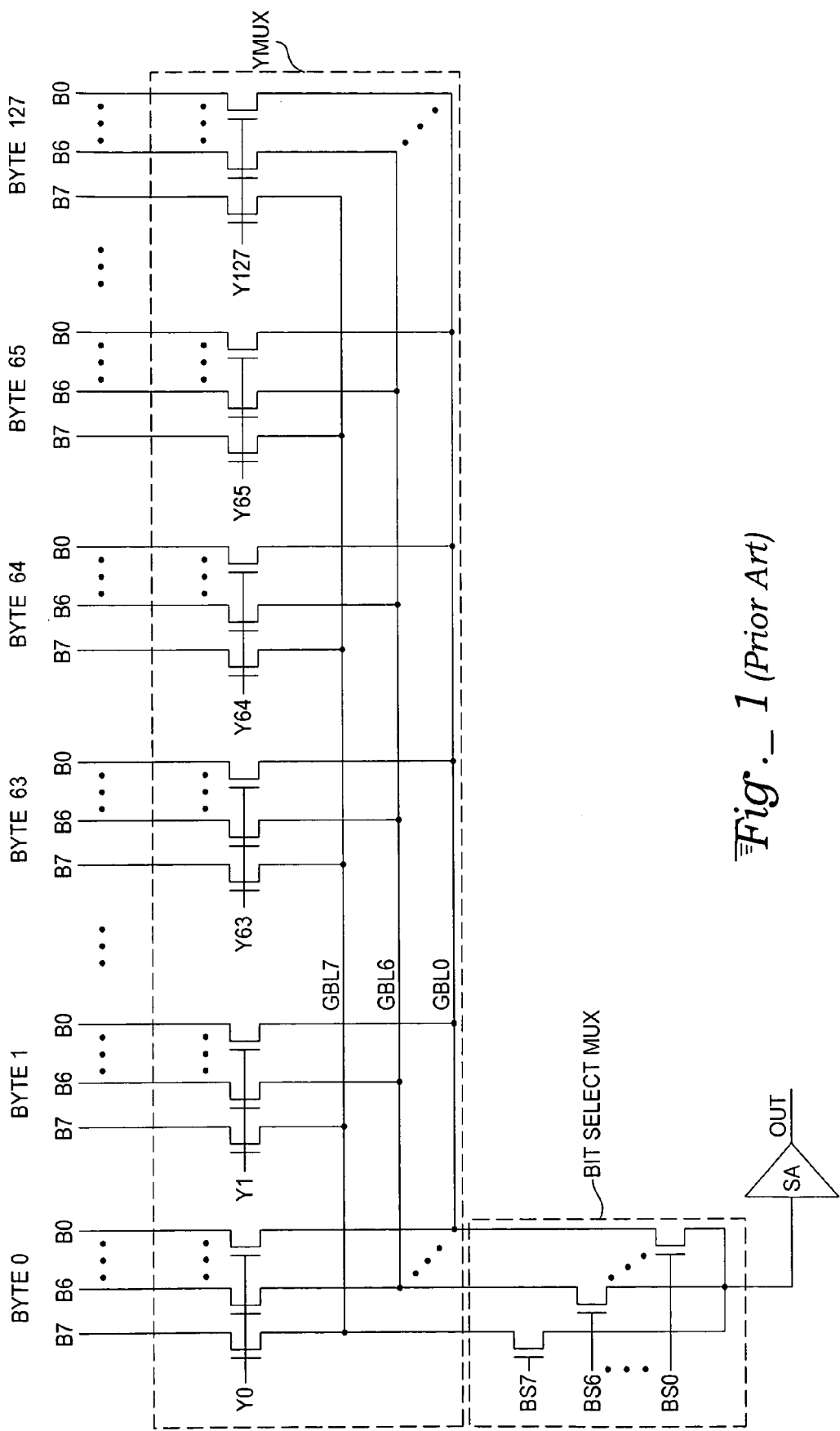
Fig. _ 1 (Prior Art)

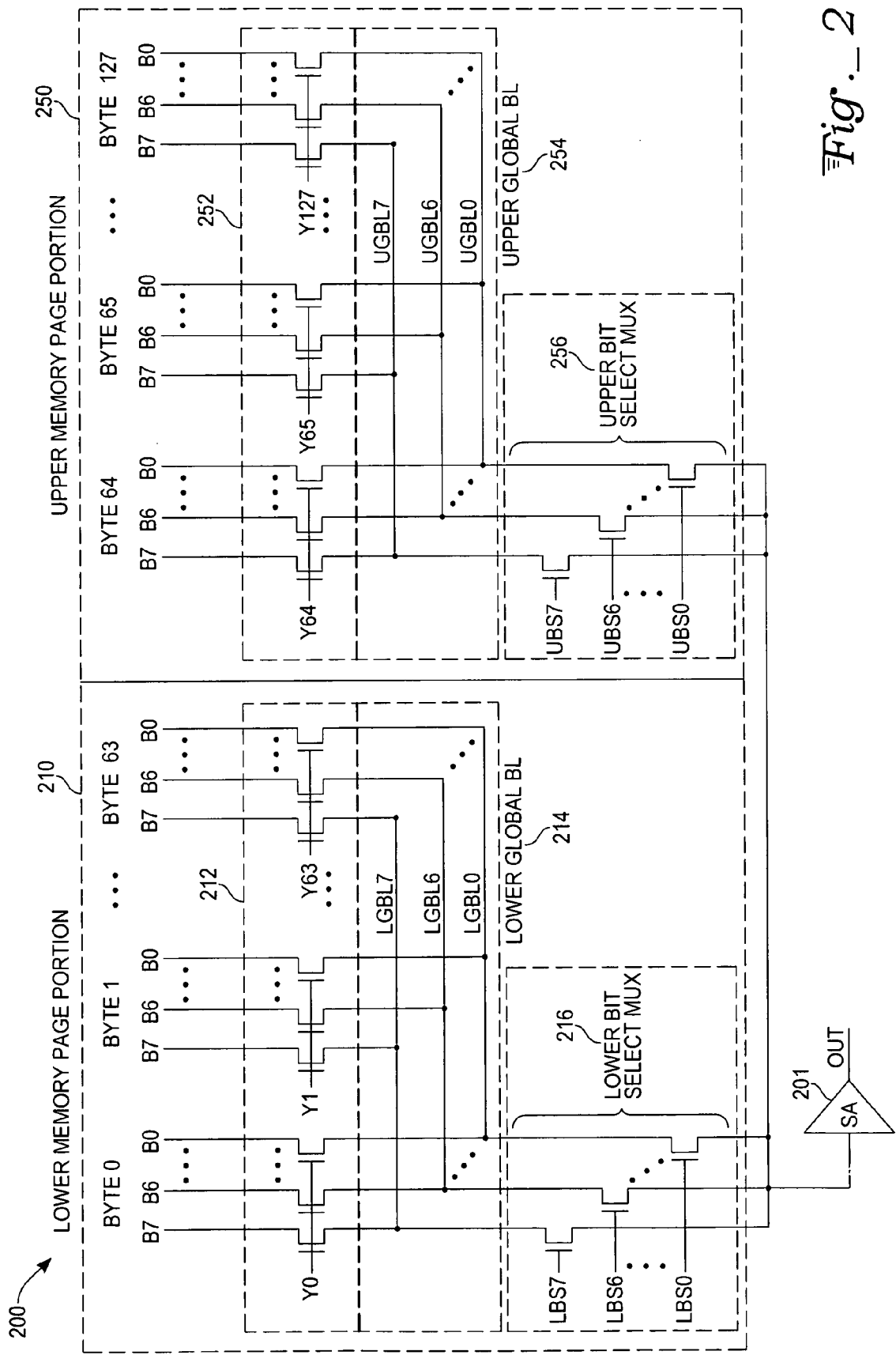
Fig._2

Y-MUX SPLITTING SCHEME

TECHNICAL FIELD

The present invention relates to a semiconductor integrated circuit device, and more particularly to a memory circuit incorporating multiple column decoder connections.

BACKGROUND ART

In FIG. 1, a prior art bit-select circuit comprises multiple address bytes organized into eight bits each. Semiconductor memory chips usually organize a memory array into rows and columns. Each row of memory array elements shares a connection commonly known as a wordline. Each column of memory array elements shares a connection commonly known as a bitline (B7, B6, . . . , B0). The specific intersection of a wordline and a bitline at a memory cell is used to provide a read and write capability for the cell. Typically, eight bitlines are organized as a byte, providing a conveniently sized grouping for handling data within the memory array.

Every bitline from the memory array is connected to peripheral logic outside the array by a passgate transistor. FIG. 1 includes eight pass-gate transistors (only three shown) contained within a bit-select multiplexer ("mux"). During a memory read operation, eight pass gates connecting eight bitlines of the same byte to the peripheral logic are enabled by a y-decoder output signal (e.g., decoder signal Y0 enables BYTE 0). When a subsequent eight bits of data are read, eight pass gates connecting eight bitlines of an adjacent byte are enabled by another y-decoder signal (i.e., decoder signal Y1 enables BYTE 1). The pass-gate transistors coupled to the decoder signals (Y0, Y1, Y127) are collectively known as the y-multiplexer or y-mux.

The bitline signals passed by the y-mux are connected in an organized fashion before being passed to a bit-select multiplexer. All B0 bits from bytes 0 . . . 127 are connected to a global bitline GBL0. Similarly, all B1 bits from bytes 0 . . . 127 are connected to a global bitline GBL1. Analogous connections are replicated with the remaining bitlines. The bit-select multiplexer selects one global bitline at a time during sensing, and couples the selected bitline to a sense amplifier SA.

However, the prior art bit-select multiplexer suffers from a deficiency as the memory size increases. Specifically, as the number of bytes in the memory page (also referred to as the memory page size) increases, the number of passgates connected to the global bitlines increases. This increases the electrical loading on the global bitlines, thus slowing down the sensing speed of the sense amplifier SA. Therefore, what is needed is a way to continually increase a number of bytes in a memory page while not increasing electrical loading on the bitlines, thereby maintaining the sensing speed of the sense amplifier.

SUMMARY OF THE INVENTION

The present invention divides the memory array into portions, in an exemplary embodiment, a lower page portion and an upper page portion. Each memory page addresses half of a total number of memory bytes, thereby reducing a length of global bitlines within the memory page. Separate memory page multiplexers are employed for the lower and upper memory pages with each multiplexer coupled to a common sense amplifier.

In operation, there is a bit select mux for each page portion. For example, only one of either a lower bit select mux or an upper bit select mux operates to select and couple a bitline to a sense amplifier at a given time. By operating in this way and allowing only one multiplexer to couple a bitline signal at any given time, read operations associated with the lower memory page do not interfere with read operations associated with the upper memory page. One skilled in the art will recognize that, when pages are separated into two portions, lower and upper global bitlines are half as long as the global bitlines in the prior art of FIG. 1. Consequently the global bitlines exhibit half as much electrical loading as the global bitlines of the prior art. A reduced global bitline length and loading of the present invention results in a commensurately higher speed operation.

BRIEF DESCRIPTION OF THE DRAWINGS

FIG. 1 is a schematic diagram of a bit-select circuit as known in the prior art.

FIG. 2 is a schematic diagram of a bit-select circuit according to an exemplary embodiment of the present invention.

DETAILED DESCRIPTION OF THE INVENTION

With reference to FIG. 2, an exemplary embodiment of a bit-select circuit 200 comprises a lower memory page portion 210 and an upper memory page portion 250. A lower page y-mux portion 212 comprises address bytes BYTE0 through BYTE63 of the lower memory page portion 210 providing a total of 64 bytes addressed. An upper page y-mux portion 252 comprises address bytes BYTE64 through BYTE127 of the upper memory page portion 250 providing a total of 64 address bytes in the upper page, and a total of 128 address bytes considering the lower and upper memory pages in combination. Each of the address bytes BYTE0 through BYTE127 comprises eight bitlines B0 through B7. Skilled artisans will appreciate that the notation used in FIG. 2 is commonly employed and will further recognize that, for example, bitline B0 of address BYTE0 is distinct and separate from bitline B0 of address BYTE1.

Passgate transistors in the lower page y-mux portion 212 couple the bitlines comprising address bytes BYTE0 through BYTE63 to a lower global bitlines group 214, comprising lower global bitlines LGBL0 through LGBL7. The B0 bitlines comprising BYTE0 through BYTE63 are coupled to the lower global bitlines LGBL0. The B1 bitlines comprising BYTE0 through BYTE63 are coupled to the lower global bitline LGBL1. Analogous couplings are replicated with the remaining bitlines in BYTE0 through BYTE63.

Passgate transistors in the upper page y-mux portion 252 couple the bitlines comprising address bytes BYTE64 through BYTE127 to an upper global bitlines group 254, comprising upper global bitlines UGBL0 through UGBL7. The B0 bitlines comprising BYTE64 through BYTE127 are coupled to the upper global bitline UGBL0. The B1 bitlines comprising BYTE64 through BYTE127 are coupled to the upper global bitline UGBL1. Analogous couplings are replicated with the remaining bitlines in BYTE64 through BYTE127.

The lower global bitlines group 214 is coupled to a sense amplifier 201 by a lower bit-select mux 216. The lower bit-select mux 216 is comprised of eight mux transistors, each transistor having one of eight lower bit-select control signals coupled to a gate terminal of the transistor. The lower global bitline LGBL0 is coupled to the sense amplifier 201 by the transistor associated with a lower bit-select control signal LBS0. The lower global bitline LGBL1 is coupled to the sense amplifier 201 by the transistor associated with a lower bit-select control signal LBS1. The remaining lower global bitlines LGBL2 . . . LGBL7 are coupled in an analogous manner.

The upper global bitlines group 254 is coupled to a sense amplifier 201 by an upper bit-select mux 256. The upper bit-select mux 256 is comprised of eight mux transistors, each transistor having one of eight upper bit-select control signals coupled to a gate terminal of the transistor. The upper global bitline UGBL0 is coupled to the sense amplifier 201 by the transistor associated with an upper bit-select control signal UBS0. The upper global bitline UGBL1 is coupled to the sense amplifier 201 by the transistor associated with an upper bit-select control signal UBS1. The remaining upper global bitlines UGBL2 . . . UGBL7 are coupled in an analogous manner.

In operation, only one of the lower bit select mux 216 and the upper bit select mux 256 operates to select and couple a bitline to the sense amplifier 201 at a given time. By operating to allow only one multiplexer to couple a bitline signal at any given time, read operations associated with the lower memory page portion 210 do not interfere with read operations associated with the upper memory page portion 250.

Skilled artisans will recognize that the lower and upper global bitlines as described supra are half as long as the global bitlines in the prior art of FIG. 1, and consequently exhibit only half as much electrical loading as the global bitlines of the prior art. The reduced global bitline length and loading of the present invention results in higher speed operation of the sense amplifier 201.

In the foregoing specification, the present invention has been described with reference to specific embodiments thereof. It will, however, be evident that various modifications and changes can be made thereto without departing from the broader spirit and scope of the present invention as set forth in the appended claims. For example, in the exemplary embodiment, the memory page division is presented in terms of an upper and a lower memory page having a combined total of 128 bytes of addressing. However, other embodiments are possible with different page sizes. If a larger memory page size is desired, the global bitline loading can be maintained under a constant value by repeating the splitting scheme as described supra to limit the number of bytes associated with a specific bit-select mux. Furthermore, it is possible to associate even fewer than eight bits with a single bit-select mux in order to decrease loading effects further. The association of fewer than eight bytes per bit-select mux could be desirable if even greater sense amplifier speed were required. The specification and drawings are, accordingly, to be regarded in an illustrative rather than a restrictive sense.

What is claimed is:

1. An electronic circuit, comprising:
a memory circuit, the memory circuit having an array of memory cells organized into rows and columns, the memory circuit further comprising a sense amplifier having a sense amplifier input and a sense amplifier output, a first bit select multiplexer and a second bit select multiplexer, the first bit select multiplexer and the second bit select multiplexer configured to couple one of either a plurality of first-page global bitlines and a plurality of second-page global bitlines to the sense amplifier input;
a plurality of first-page bit address lines, the plurality of first-page bit lines organized so as to be able to access a plurality of first-page data byte locations, each of the plurality of first-page data byte locations having a number of unique first-page bit address lines equal in number to the plurality of first-page global bit lines;
a plurality of second-page bit address lines, the plurality of second-page bit lines organized so as to be able to access a plurality of second-page data byte locations, each of the plurality of second-page data byte locations having a number of unique second-page bit address lines equal in number to the plurality of second-page global bit lines;
a first-page column multiplexer configured to couple one of the plurality of first-page data byte locations to one of the plurality of first-page global bitlines such that each of the plurality of first-page bit address lines comprising the coupled first-page data byte location is coupled to one of the plurality of first-page global bitlines; and
a second-page column multiplexer configured to couple one of the plurality of second-page data byte locations to one of the plurality of second-page global bitlines such that each of the plurality of second-page bit address lines comprising the coupled second-page data byte location is coupled to one of the plurality of second-page global bitlines.

2. The electronic circuit of claim 1, wherein:
the plurality of first-page data global bitlines numbers eight first-page global bitlines and the plurality of second-page global bitlines numbers eight second-page global bitlines;
the plurality of first-page data byte locations numbers 64 first-page data byte locations and the plurality of second-page data byte locations numbers 64 second-page data byte locations.

3. The electronic circuit of claim 1, wherein:
the first bit-select multiplexer and the second bit-select multiplexer further comprise NMOS transistors; and
the first-page column multiplexer and the second-page column multiplexer further comprise NMOS transistors.

4. A method for partitioning and operating a multiplexer circuit, the method comprising:
subdividing a memory array into multiple page portions, each of the multiple page portions having a plurality of column bitlines organized for accessing data byte locations;
providing each memory page portion with a unique column bitline multiplexer, a unique bit-select multiplexer and a unique set of memory page global bitlines; and
reading the memory by using the column bitline multiplexers to couple a specific data byte location of at least one memory page portion to the memory page global bitlines and enabling at most one of the bit-select multiplexers to couple at most one memory page global bitline to a sense amplifier input.

5. An electronic circuit, comprising:
a memory circuit, the memory circuit having an array of memory cells organized into rows and columns, the columns further organized into page-portions, the memory circuit further comprising a sense amplifier having a sense amplifier input and a sense amplifier output, and a plurality of bit-select multiplexers, the bit-select multiplexers configured to couple one of a plurality of page-portion global bitlines to the sense amplifier input;

a plurality of column address lines comprising each page-portion, the plurality of column address lines organized so as to be able to access a plurality of page-portion data byte locations, each of the plurality of page-portion data byte locations having a number of unique column address lines equal in number to the plurality of page-portion global bitlines; and a plurality of column multiplexers configured to couple one of the plurality of page-portion data byte locations to one of the plurality of the page-portion global bitlines such that each of the plurality of column address lines comprising the page-portion data byte location is coupled to one of plurality of the page-portion global bitlines.

6. The electronic circuit of claim 5, wherein:

the plurality of page-portions comprises a lower memory page and an upper memory page;

the plurality of bit-select multiplexers comprises a lower bit-select multiplexer and an upper bit-select multiplexer;

the page-portion data byte locations comprise eight column address lines;

the plurality of column multiplexers comprises a lower page column multiplexer and an upper page column multiplexer; and the page-portion global bitlines comprise lower global bitlines and upper global bitlines.

7. An apparatus comprising:

a storage means for accepting binary data, the storage means organized into rows and columns;

an amplification means for accepting an input signal and providing an output signal;

a first bit selection means and a second bit selection means for selecting one of a plurality of first-page global bitline signals and one of a plurality of second-page global bitline signals as the input signal to the amplification means;

a first-page byte addressing means for selecting one of a plurality of first-page byte locations, the plurality of first-page byte locations conveying a number of unique first-page bit column signals equal in number to the plurality of first-page global bitlines;

a second-page byte addressing means for selecting one of a plurality of second-page byte locations, the plurality of second-page byte locations conveying a number of unique second-page bit column signals equal in number to the plurality of second-page global bitlines;

a first-page column multiplexer means for coupling one of the plurality of first-page byte locations to the plurality of first-page global bitline signals such that each of the unique first-page column signals is coupled to one of the plurality of first-page global bitline signals; and a second-page column multiplexer means for coupling one of the plurality of second-page byte locations to the plurality of second-page global bitline signals such that each of the unique second-page column signals is coupled to one of the plurality of second-page global bitline signals.

* * * * *